US012562700B2

(12) United States Patent
Park

(10) Patent No.: US 12,562,700 B2
(45) Date of Patent: Feb. 24, 2026

(54) SELF-CONTROLLED EQUALIZATION CIRCUIT CAPABLE OF PROVIDING AN AUTOMATIC GAIN CONTROL MECHANISM

(71) Applicant: Fujian Jinhua Integrated Circuit Co., Ltd., Quanzhou (CN)

(72) Inventor: Minho Park, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 475 days.

(21) Appl. No.: 18/143,062

(22) Filed: May 3, 2023

(65) Prior Publication Data

US 2024/0204740 A1 Jun. 20, 2024

(30) Foreign Application Priority Data

Dec. 15, 2022 (CN) .......................... 202211615791.X
Dec. 15, 2022 (CN) .......................... 202223372412.7

(51) Int. Cl.
*H03F 3/45* (2006.01)
*H03F 1/02* (2006.01)
*H03G 3/30* (2006.01)

(52) U.S. Cl.
CPC ....... *H03F 3/45183* (2013.01); *H03F 1/0222* (2013.01); *H03G 3/3036* (2013.01); *H03F 3/45071* (2013.01); *H03F 2200/372* (2013.01)

(58) Field of Classification Search
CPC ............... H03F 3/45183; H03F 1/0222; H03F 2200/372; H03F 2203/45488; H03F 3/45197; H03F 3/45475; H03F 3/45071;

H03F 3/45179; H03F 3/45192; H03F 3/45089; H03F 1/34; H03G 3/3036; H03G 1/0023; H03G 1/0088; H03G 3/45098; H04L 25/03885
See application file for complete search history.

(56) References Cited

U.S. PATENT DOCUMENTS

| | | | |
|---|---|---|---|
| 7,622,986 B2 | 11/2009 | Pan | |
| 7,701,257 B2 | 4/2010 | Bae | |
| 7,817,714 B2 | 10/2010 | Bae | |
| 8,391,347 B2 | 3/2013 | Kim | |
| 9,331,646 B2 | 5/2016 | Taylor | |
| 10,348,534 B1 | 7/2019 | Sreeramaneni | |

(Continued)

*Primary Examiner* — Khanh V Nguyen
(74) *Attorney, Agent, or Firm* — Winston Hsu

(57) ABSTRACT

A self-controlled equalization circuit includes a first amplifier, a second amplifier, a feedback signal generator, a frequency delay signal generator, a feedback enabling unit, an equalization control unit, and a gain control unit. The first amplifier includes a first input terminal and a second input terminal. The second amplifier is coupled to the first amplifier. The feedback signal generator is coupled to the second amplifier. The frequency delay signal generator is used for receiving a frequency signal. The feedback enabling unit is coupled to the output terminal of the frequency delay signal generator and the feedback signal generator. The equalization control unit is coupled to the feedback signal generator, the feedback enabling unit, and the first amplifier. The gain control unit is coupled to the feedback signal generator, the second input terminal of the first amplifier, and output terminals of the first amplifier.

10 Claims, 5 Drawing Sheets

(56) References Cited

U.S. PATENT DOCUMENTS

| | | | | |
|---|---|---|---|---|
| 10,979,256 B2 * | 4/2021 | Sun | .................... | H03G 1/0088 |
| 10,992,277 B1 * | 4/2021 | Sun | .................... | H03G 3/3036 |
| 11,736,069 B2 * | 8/2023 | Liu | .................... | H03F 1/14 |
| | | | | 330/277 |
| 11,863,139 B2 * | 1/2024 | Kang | .................... | H03F 1/14 |

* cited by examiner

10

11

SELF-CONTROLLED EQUALIZATION CIRCUIT CAPABLE OF PROVIDING AN AUTOMATIC GAIN CONTROL MECHANISM

BACKGROUND OF THE INVENTION

1. Field of the Invention

The present invention illustrates a self-controlled equalization circuit, and more particularly, a self-controlled equalization circuit capable of providing automatic gain control mechanism and equalization effect.

2. Description of the Prior Art

With the rapid development of technology, various volatile and non-volatile memory components are used in computer systems. Dynamic random access memory (DRAM) is a semiconductor memory categorized as a volatile memory. DRAM can use a plurality of charges stored in a capacitor for indicating if a binary bit logic is 1 or 0. DRAM can be regarded as a short-term data storage unit of the computer system. Since DRAM can be used for saving data currently used, the data currently used can be quickly accessed by the computer system.

Further, DRAM can provide high-speed data transmission capability and high bandwidth utilization. However, channel noise may be introduced when DRAM provides high-speed data transmission capability and high bandwidth utilization. Further, noise can be introduced when a data sampling mechanism of DRAM is performed. Further, since the high-speed data transmission capability and high bandwidth utilization of DRAM are required, power consumption is greatly increased. Therefore, to develop a self-controlled equalization circuit capable of providing an automatic gain control mechanism and equalization effect for minimizing noise interference and optimizing power consumption is an important issue.

SUMMARY OF THE INVENTION

In an embodiment of the present invention, a self-controlled equalization circuit is disclosed. The self-controlled equalization circuit comprises a first amplifier, a second amplifier, a feedback signal generator, a frequency delay signal generator, a feedback enabling unit, an equalization control unit, and a gain control unit. The first amplifier comprises a first input terminal configured to receive a data signal, a second input terminal configured to receive a reference signal, a first output terminal, and a second output terminal. The second amplifier is coupled to the first output terminal of the first amplifier and the second output terminal of the first amplifier. The feedback signal generator is coupled to the second amplifier. The frequency delay signal generator comprises an input terminal configured to receive a frequency signal and an output terminal. The feedback enabling unit is coupled to the output terminal of the frequency delay signal generator and the feedback signal generator. The equalization control unit is coupled to the feedback signal generator, the feedback enabling unit, the second input terminal of the first amplifier, the first output terminal of the first amplifier, and the second output terminal of the first amplifier. The gain control unit is coupled to the feedback signal generator, the second input terminal of the first amplifier, the first output terminal of the first amplifier, and the second output terminal of the first amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
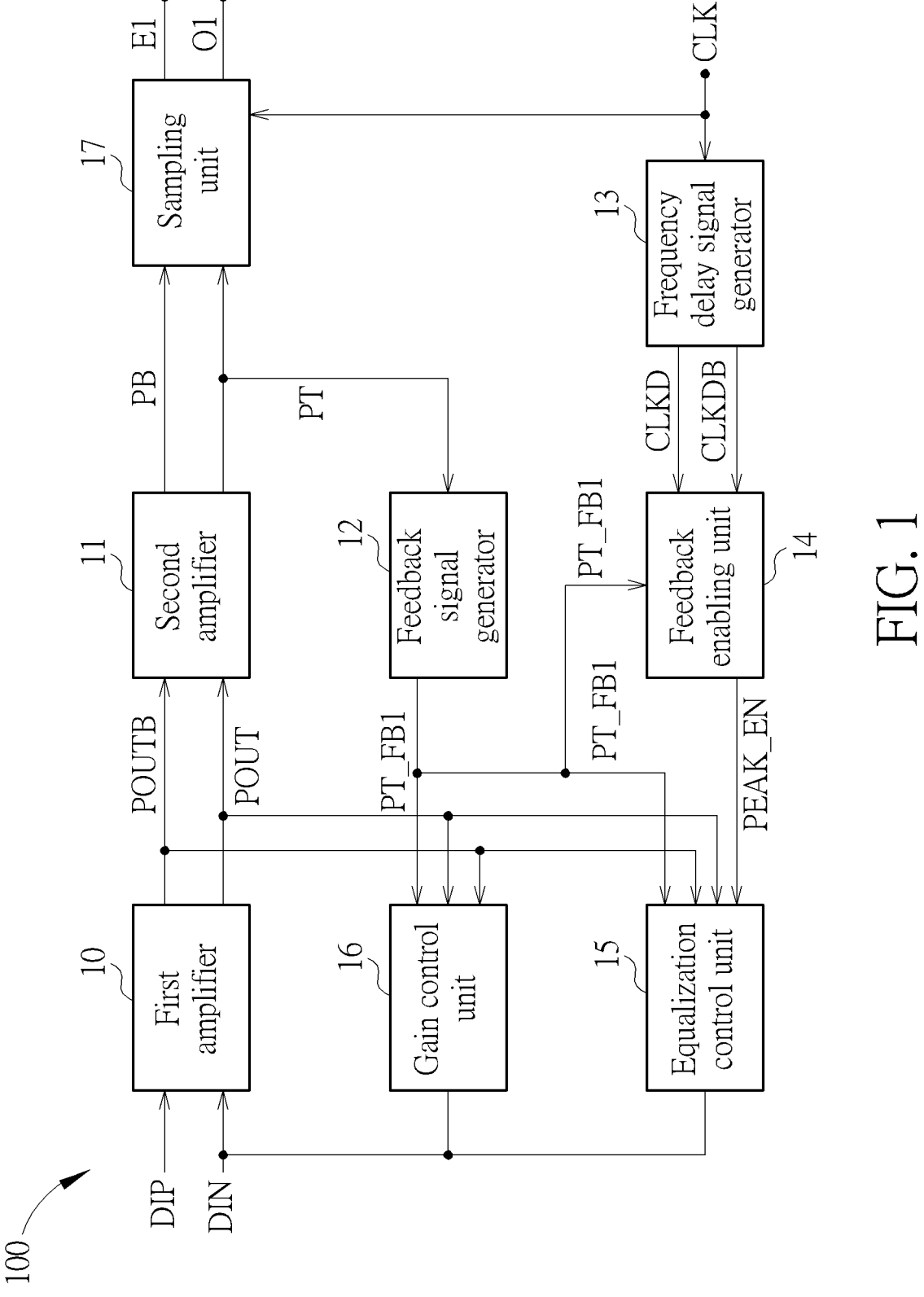
FIG. 1 is a block diagram of a self-controlled equalization circuit according to an embodiment of the present invention.

FIG. 1 is a block diagram of a self-controlled equalization circuit 100 according to an embodiment of the present invention. The self-controlled equalization circuit 100 can be used for performing an automatic gain control mechanism and providing an equalization effect. Therefore, the self-controlled equalization circuit 100 can minimize noise interference and optimize power consumption. Details of the self-controlled equalization circuit 100 are illustrated below. The self-controlled equalization circuit 100 includes a first amplifier 10, a second amplifier 11, a feedback signal generator 12, a frequency delay signal generator 13, a feedback enabling unit 14, an equalization control unit 15, and a gain control unit 16. The first amplifier 10 includes a first input terminal, a second input terminal, a first output terminal, and a second output terminal. The first input terminal is used for receiving a data signal DIP. The second input terminal is used for receiving a reference signal DIN. The first output terminal is used for outputting a first output signal POUTB. The second output terminal is used for outputting a second output signal POUT. The second amplifier 11 is coupled to the first output terminal of the first amplifier 10. The second amplifier 11 is coupled to the second output terminal of the first amplifier 10. The second amplifier 11 has a first output terminal and a second output terminal. The first output terminal of the second amplifier 11 is used for outputting a third output signal PB. The second output terminal of the second amplifier 11 is used to output a fourth output signal PT. The feedback signal generator 12 is coupled to the second amplifier 11. The frequency delay signal generator 13 includes an input terminal for receiving a frequency signal CLK, and two output terminals. The feedback enabling unit 14 is coupled to the two output terminals of the frequency delay signal generator 13 and the feedback signal generator 12. The equalization control unit 15 is coupled to the feedback signal generator 12, the feedback enabling unit 14, the second input terminal of the first amplifier 10, the first output terminal of the first amplifier 10, and the second output terminal of the first amplifier 10. The gain control unit 16 is coupled to the feedback signal generator 12, the second input terminal of the first amplifier 10, the first output terminal of the first amplifier 10, and the second output terminal of the first amplifier 10. In the self-control equalization circuit 100, the first amplifier 10, the second amplifier 11, the feedback signal generator 12, the feedback enabling unit 14, the equalization control unit 15, and the gain control unit 16 can form a circuit loop capable of performing the automatic gain control mechanism and providing the equalization effect. For example, after the data signal DIP is amplified by the first amplifier 10 and the second amplifier 11, it can be outputted to the feedback signal generator 12 for generating a feedback signal PT_FB1. After the feedback signal PT_FB1 is received by the feedback enabling unit 14, a feedback enabling signal PEAK_EN can be generated. Output signals POUTB and POUT of the first amplifier 10 can be further processed by the equalization control unit 15 for reducing the noise interference according to the feedback enabling signal PEAK_EN and the feedback signal PT_FB1. Further, after the data signal DIP is processed by the first amplifier 10, the output signals POUTB and POUT of the first amplifier 10 can be processed by the gain control unit 16 according to the feedback signal PT_FB1. Therefore, power consumption of the self-controlled equalization circuit 100 can be optimized. Circuit details of the self-controlled equalization circuit 100 are illustrated below.

Figure 2:
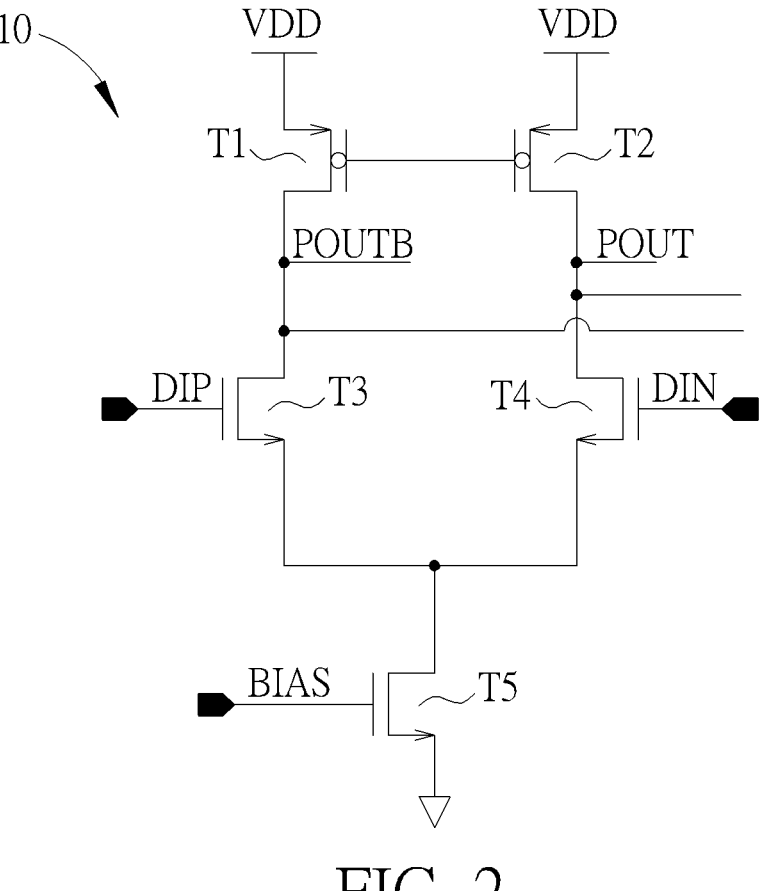
FIG. 2 is a structure of a first amplifier of the self-controlled equalization circuit in FIG. 1.
Figure 3:
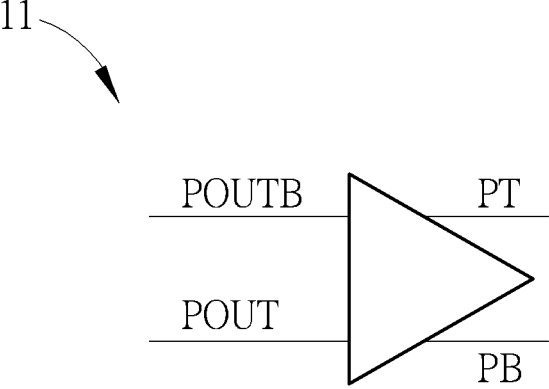
FIG. 3 is a structure of a second amplifier of the self-controlled equalization circuit in FIG. 1.

FIG. 2 is a structure of the first amplifier 10 of the self-controlled equalization circuit 100. FIG. 3 is a structure of the second amplifier 11 of the self-controlled equalization circuit 100. The first amplifier 10 and the second amplifier 11 can be any type of amplifier. For example, the first amplifier 10 and the second amplifier 11 can be voltage amplifiers, current amplifiers, or differential amplifiers. In FIG. 2, the first amplifier 10 can be the differential amplifier. The first amplifier 10 can include a first transistor T1, a second transistor T2, a third transistor T3, a fourth transistor T4, and a fifth transistor T5. The first transistor T1 includes a first terminal for receiving a working voltage VDD, a second terminal, and a control terminal. The second transistor T2 includes a first terminal for receiving the working voltage VDD, a second terminal, and a control terminal coupled to the control terminal of the first transistor T1. The third transistor T3 includes a first terminal coupled to the second terminal of the first transistor T1, a second terminal, and a control terminal for receiving the data signal DIP. The fourth transistor T4 includes a first terminal coupled to the second terminal of the second transistor T2, a second terminal coupled to the second terminal of the third transistor T3, and a control terminal for receiving the reference signal DIN. The fifth transistor T5 includes a first terminal coupled to the second terminal of the fourth transistor T4, a second terminal coupled to a ground terminal, and a control terminal for receiving a biased voltage signal BIAS. Here, the biased voltage signal BIAS can be a customized or predetermined voltage signal for controlling a conduction state of the fifth transistor T5. For example, when the transistor T5 fifth is an N-Type Metal-Oxide-Semiconductor Field-Effect Transistor, a voltage of the biased voltage signal BIAS can control the conduction state of the fifth transistor T5. Therefore, a current outputted from the first amplifier 10 to the fifth transistor T5 can also be controlled by the biased voltage signal BIAS. Further, when the third transistor T3 and the fourth transistor T4 are operated in a linear region and the first transistor T1 and the second transistor T2 are enabled, two outputs of the first amplifier 10 (i.e., the first output signal POUTB and the second output signal POUT) can be linearly amplified. Particularly, the first output signal POUTB is at the first terminal of the third transistor T3. The second output signal POUT is at the first terminal of the fourth transistor T4. Further, the first output signal POUTB and the second output signal POUT are complementary. In FIG. 3, the second amplifier 11 can be the differential amplifier. The first output signal POUTB and the second output signal POUT of the first amplifier 10 are inputted to the second amplifier 11. The second amplifier 11 includes a first input terminal coupled to the first output terminal of the first amplifier 10, a second input terminal coupled to the second output terminal of the first amplifier 10, a first output terminal coupled to the feedback signal generator 12, and a second output terminal. Therefore, the first output signal POUTB and the second output signal POUT can be amplified to generate the third output signal PB and the fourth output signal PT by the second amplifier 11. Here, the third output signal PB and the fourth output signal PT are complementary.

Figure 4:
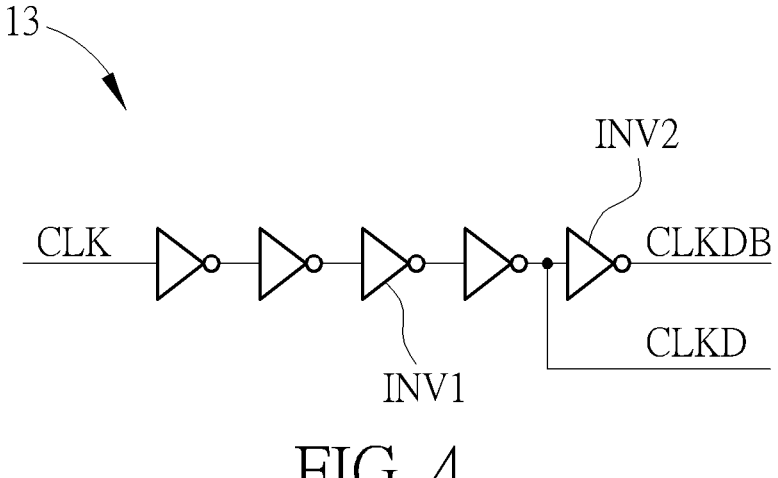
FIG. 4 is a structure of a frequency delay signal generator of the self-controlled equalization circuit in FIG. 1.

FIG. 4 is a structure of the frequency delay signal generator 13 of the self-controlled equalization circuit 100. The frequency delay signal generator 13 includes a plurality of first inverters INV1 coupled in series, and a second inverter INV2. The plurality of first inverters INV1 are used for receiving a frequency signal CLK and outputting a frequency delay signal CLKD. The second inverter INV2 includes an input terminal for receiving the frequency delay signal CLKD, and an output terminal for outputting an inverse frequency delay signal CLKDB. In FIG. 4, the number of inverters in the frequency delay signal generator 13 is not limited. However, since the inverse frequency delay signal CLKDB can be generated by one more inverter than the frequency delay signal CLKD, the inverse frequency delay signal CLKDB and the frequency delay signal CLKD are complementary. Further, since each inverter has its time delay, the more inverters used to the frequency delay signal generator 13, the greater time delay is introduced.

Figure 5:
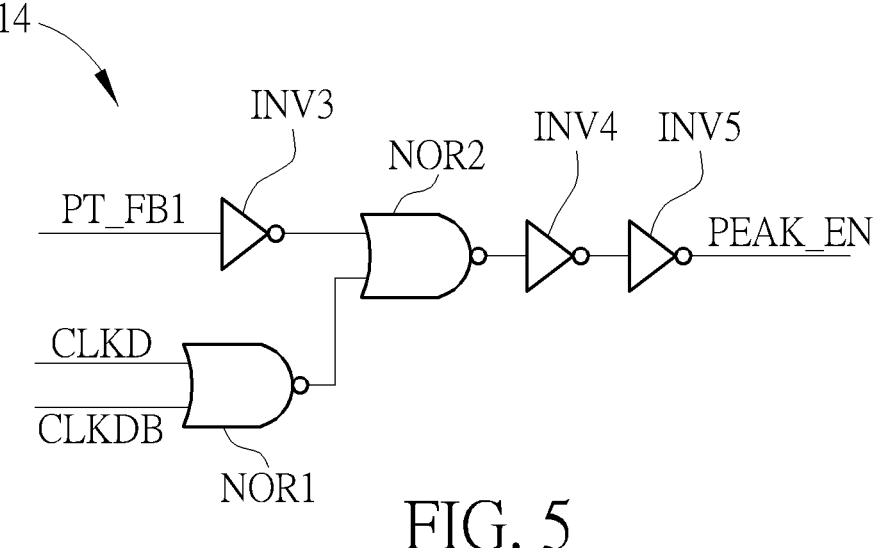
FIG. 5 is a structure of a feedback enabling unit of the self-controlled equalization circuit in FIG. 1.

FIG. 5 is a structure of the feedback enabling unit 14 of the self-controlled equalization circuit 100. The feedback enabling unit 14 includes a third inverter INV3, a first NOR gate NOR1, a second NOR gate NOR2, a fourth inverter INV4, and a fifth inverter INV5. The third inverter INV3 includes an input terminal coupled to the feedback signal generator 12 for receiving the feedback signal PT_FB1, and an output terminal. The first NOR gate NOR1 includes a first input terminal coupled to the frequency delay signal generator 13 for receiving the frequency delay signal CLKD, a second input terminal coupled to the frequency delay signal generator 13 for receiving the inverse frequency delay signal CLKDB, and an output terminal. The second NOR gate NOR2 includes a first input terminal coupled to the output terminal of the third inverter INV3, a second input terminal coupled to the output terminal of the first NOR gate NOR1, and an output terminal. The fourth inverter INV4 includes an input terminal coupled to the output terminal of the second NOR gate NOR2, and an output terminal. The fifth inverter INV5 includes an input terminal coupled to the output terminal of the fourth inverter INV4, and an output terminal. The output terminal of the fifth inverter INV5 is used for outputting the feedback enabling signal PEAK_EN. In FIG. 5, the frequency delay signal CLKD and the inverse frequency delay signal CLKDB of the feedback enabling unit 14 are two fixed frequency signals having opposite phases. Further, the feedback signal PT_FB1 is relevant to the data signal DIP (i.e., processed by the first amplifier 10 and the second amplifier 11). Therefore, according to variations of the data signal DIP, the feedback signal PT_FB1 can be adjusted accordingly. The variations of the feedback enabling signal PEAK_EN can be acquired according to truth tables of the inverters and the NOR gates. Thus, detail derivations are omitted here.

Figure 6:
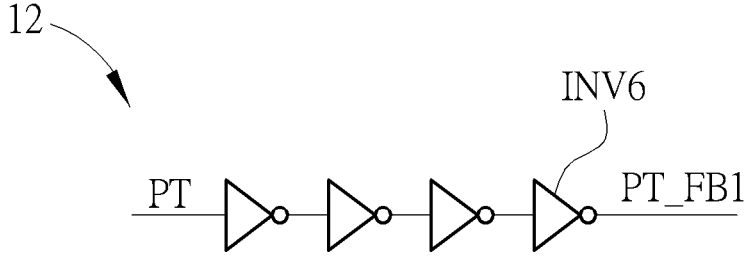
FIG. 6 is a structure of a feedback signal generator of the self-controlled equalization circuit in FIG. 1.

FIG. 6 is a structure of the feedback signal generator 12 of the self-controlled equalization circuit 100. The feedback signal generator 12 includes a plurality of sixth inverters INV6 coupled in series for delaying a signal of the first output terminal of the second amplifier 11 for outputting a feedback signal PT_FB1. In FIG. 6, the number of inverters in the feedback signal generator 12 is not limited. Further, since each inverter has its time delay, the more inverters used in the feedback signal generator 12, the greater time delay is introduced.

Figure 7:
FIG. 7 is a structure of an equalization control unit of the self-controlled equalization circuit in FIG. 1.
Figure 7:
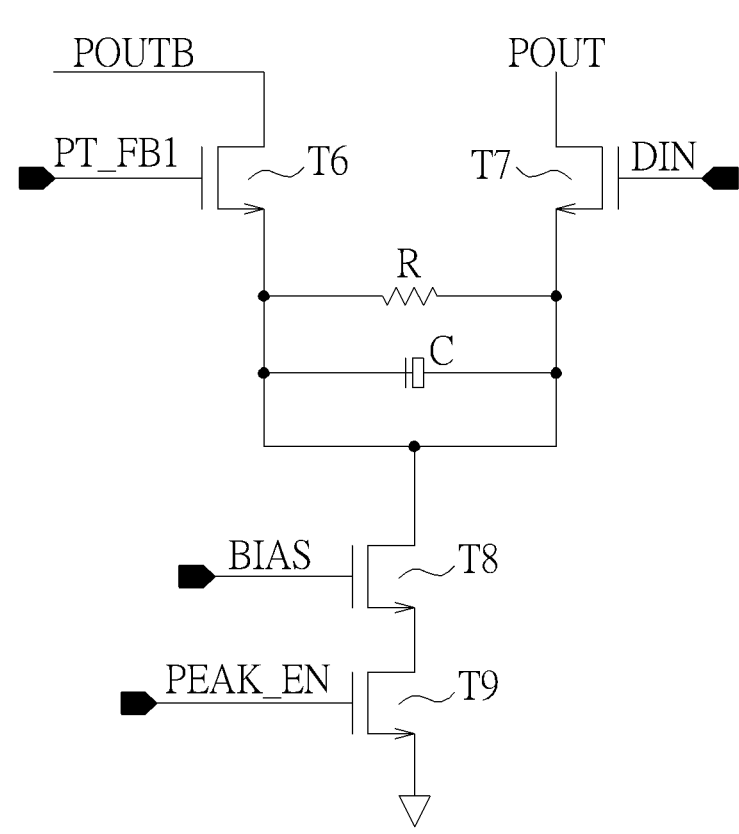

FIG. 7 is a structure of the equalization control unit 15 of the self-controlled equalization circuit 100. The equalization control unit 15 includes a sixth transistor T6, a seventh transistor T7, a resistor R, a capacitor C, an eighth transistor T8, and a ninth transistor T9. The sixth transistor T6 includes a first terminal coupled to the first output terminal of the first amplifier 10 for receiving the first output signal POUTB, a second terminal, and a control terminal coupled to the feedback signal generator 12 for receiving the feedback signal PT_FB1. The seventh transistor T7 includes a first terminal coupled to the second output terminal of the first amplifier 10 for receiving the second output signal POUT, a second terminal coupled to the second terminal of the sixth transistor T6, and a control terminal for receiving the reference signal DIN. The resistor R includes a first terminal coupled to the second terminal of the sixth transistor T6, and a second terminal coupled to the second terminal of the seventh transistor T7. The capacitor C includes a first terminal coupled to the second terminal of the sixth transistor T6, and a second terminal coupled to the second terminal of the seventh transistor T7. The eighth transistor T8 includes a first terminal coupled to the second terminal of the seventh transistor T7, a second terminal, and a control terminal for receiving the biased voltage signal BIAS. The ninth transistor T9 includes a first terminal coupled to the second terminal of the eighth transistor T8, a second terminal coupled to the ground terminal, and a control terminal coupled to the feedback enabling unit 14 for receiving the feedback enabling signal PEAK_EN. Here, the biased voltage signal BIAS can be the customized or predetermined voltage signal for controlling the conduction state of the eighth transistor T8. For example, when the eighth transistor T8 is the N-Type Metal-Oxide-Semiconductor Field-Effect Transistor (NMOSFET), the voltage of the biased voltage signal BIAS can control the conduction state of the eighth transistor T8. Therefore, a current of the eighth transistor T8 in the equalization control unit 15 can also be controlled by the biased voltage signal BIAS. Further, the ninth transistor T9 can be regarded as a switch of the equalization control unit 15. For example, when the ninth transistor T9 is an NMOSFET and the feedback enabling signal PEAK_EN is at a high voltage, the ninth transistor T9 is enabled, and the equalization control unit 15 is turned on. When the ninth transistor T9 is the NMOS field effect transistor and the feedback enabling signal PEAK_EN is at a low voltage, the ninth transistor T9 is disabled, and the equalization control unit 15 is turned off. Further, since the reference signal DIN is received by the control terminal of the seventh transistor T7, a cross voltage between the reference signal DIN and the second output signal POUT can control the conduction state of the seventh transistor T7. Similarly, since the feedback signal PT_FB1 is received by the control terminal of the sixth transistor T6, a cross-voltage between the feedback signal PT_FB1 and the first output signal POUTB can control the conduction state of the sixth transistor T6. Further, the equalization control unit 15 can provide the equalization effect and can filter out noise interference by using the resistor R and the capacitor C. For example, when the equalization control unit 15 is turned on and the sixth transistor T6 and the seventh transistor T7 are enabled, since the voltages of the first output signal POUTB and the second output signal POUT are complementary, a current between the sixth transistor T6 and the seventh transistor T7 can be generated. Further, since the resistor R and the capacitor C are located on a current path between the sixth transistor T6 and the seventh transistor T7, noise interference of the current at a high frequency between the sixth transistor T6 and the seventh transistor T7 can be reduced. In other words, in the self-controlled equalization circuit 100, noise of signals outputted from the first amplifier 10 and the second amplifier 11 is greater than noise of the signal outputted from the equalization control unit 15.

Figure 8:
FIG. 8 is a structure of a gain control unit of the self-controlled equalization circuit in FIG. 1.
Figure 8:
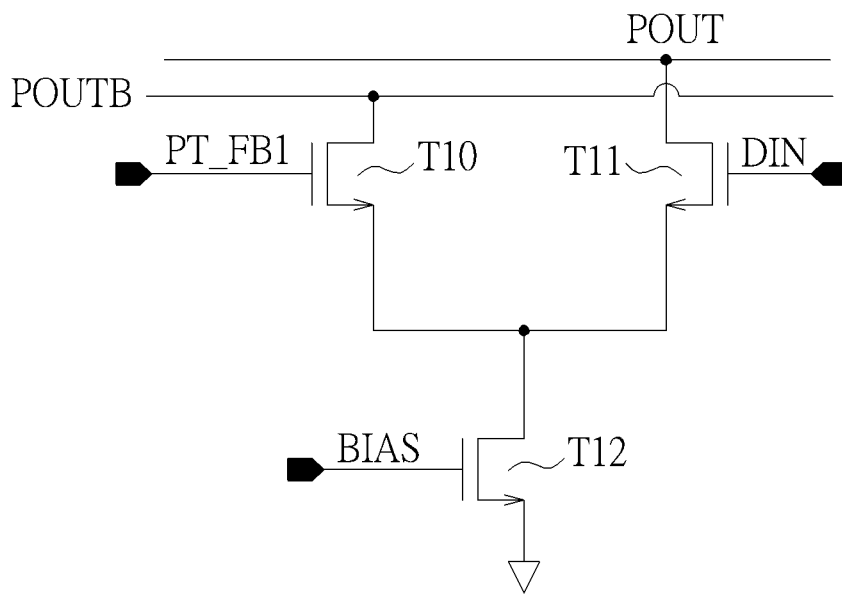

FIG. 8 is a structure of the gain control unit 16 of the self-controlled equalization circuit 100. The gain control unit 16 includes a tenth transistor T10, an eleventh transistor T11, and a twelfth transistor T12. The tenth transistor T10 includes a first terminal coupled to the first output terminal of the first amplifier 10 for receiving the first output signal POUTB, a second terminal, and a control terminal coupled to the feedback signal generator 12 for receiving the feedback signal PT_FB1. The eleventh transistor T11 includes a first terminal coupled to the second output terminal of the first amplifier 10 for receiving the second output signal POUT, a second terminal coupled to the second terminal of the tenth transistor T10, and a control terminal for receiving the reference signal DIN. The twelfth transistor T12 includes a first terminal coupled to the second terminal of the eleventh transistor T11, a second terminal coupled to the ground terminal, and a control terminal for receiving the biased voltage signal BIAS. Here, the biased voltage signal BIAS can be the customized or predetermined voltage signal for controlling a conduction state of the twelfth transistor T12. For example, when the twelfth transistor T12 is an NMOSFET, a voltage of the biased voltage signal BIAS can control the conduction state of the twelfth transistor T12. Therefore, a current of the twelfth transistor T12 in the gain control unit 16 can also be controlled by the biased voltage signal BIAS. Similarly, since the reference signal DIN is received by the control terminal of the eleventh transistor T11, a cross voltage between the reference signal DIN and the second output signal POUT can control the conduction state of the eleventh transistor T11. Similarly, since the feedback signal PT_FB1 is received by the control terminal of the tenth transistor T10, a cross voltage between the feedback signal PT_FB1 and the first output signal POUTB can control the conduction state of the tenth transistor T10. For example, when the tenth transistor T10 and the eleventh transistor T11 are enabled, since the voltages of the first output signal POUTB and the second output signal POUT are complementary, a current can be generated between the tenth transistor T10 and the eleventh transistor T11. Further, since the biased voltage signal BIAS can control the conduction state of the twelfth transistor T12, a part of current between the tenth transistor T10 and the eleventh transistor T11 can be transmitted to the ground terminal through the twelfth transistor T12. As a result, when the intensity of the current between the tenth transistor T10 and the eleventh transistor T11 is changed, the gain control unit 16 can adjust a power gain between the first output signal POUTB and the second output signal POUT.

In the self-controlled equalization circuit 100, as illustrated in FIG. 1, the sampling unit 17 can be introduced. The sampling unit 17 includes a first input terminal coupled to the second amplifier 11 for receiving the third output signal PB, a second input terminal coupled to the second amplifier 11 for receiving the fourth output signal PT, a third input terminal coupled to the frequency delay signal generator 13 for receiving the frequency signal CLK, a first output terminal for outputting first signals E1 latched at even time indices, and a second output terminal for outputting second signals O1 latched at odd time indices.

To sum up, the present invention illustrated a self-control equalization circuit. The self-control equalization circuit introduces a gain control unit and an equalization control unit. Therefore, the self-controlled equalization circuit of the present invention can automatically adjust the power gain and can provide an equalization effect according to the input data signal for reducing noise interference. Thus, the self-control equalization circuit can be applied to a high speed DRAM system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A self-controlled equalization circuit comprising:
a first amplifier comprising:
   a first input terminal configured to receive a data signal;
   a second input terminal configured to receive a reference signal;
   a first output terminal; and
   a second output terminal;
a second amplifier coupled to the first output terminal of the first amplifier and the second output terminal of the first amplifier;
a feedback signal generator coupled to the second amplifier;
a frequency delay signal generator comprising:
   an input terminal configured to receive a frequency signal; and
   an output terminal;
a feedback enabling unit coupled to the output terminal of the frequency delay signal generator and the feedback signal generator;
an equalization control unit coupled to the feedback signal generator, the feedback enabling unit, the second input terminal of the first amplifier, the first output terminal of the first amplifier, and the second output terminal of the first amplifier; and
a gain control unit coupled to the feedback signal generator, the second input terminal of the first amplifier, the first output terminal of the first amplifier, and the second output terminal of the first amplifier.

2. The self-controlled equalization circuit of claim 1, further comprising:
a sampling unit comprising:
   a first input terminal coupled to the second amplifier;
   a second input terminal coupled to the second amplifier;
   a third input terminal coupled to the frequency delay signal generator and configured to receive the frequency signal;
   a first output terminal configured to output first signals latched at even time indices; and a second output terminal configured to output second signals latched at odd time indices.

3. The self-controlled equalization circuit of claim 1, wherein the first amplifier further comprises:
a first transistor comprising:
   a first terminal configured to receive a power supply voltage;
   a second terminal; and
   a control terminal;
a second transistor comprising:
   a first terminal configured to receive the power supply voltage;
   a second terminal; and
   a control terminal coupled to the control terminal of the first transistor;
a third transistor comprising:
   a first terminal coupled to the second terminal of the first transistor;
   a second terminal; and
   a control terminal configured to receive the data signal;
a fourth transistor comprising:
   a first terminal coupled to the second terminal of the second transistor;
   a second terminal coupled to the second terminal of the third transistor; and
   a control terminal configured to receive the reference signal; and
a fifth transistor comprising:
   a first terminal coupled to the second terminal of the fourth transistor;
   a second terminal coupled to a ground terminal; and
   a control terminal configured to receive a biased voltage signal.

4. The self-controlled equalization circuit of claim 1, wherein the second amplifier comprises:
a first input terminal coupled to the first output terminal of the first amplifier;
a second input terminal coupled to the second output terminal of the first amplifier;
a first output terminal coupled to the feedback signal generator; and
a second output terminal.

5. The self-controlled equalization circuit of claim 1, wherein the frequency delay signal generator further comprises:
a plurality of first inverters coupled in series and configured to receive the frequency signal and output a frequency delay signal; and
a second inverter comprising:
   an input terminal configured to receive the frequency delay signal; and
   an output terminal configured to output an inverse frequency delay signal.

6. The self-controlled equalization circuit of claim 5, wherein the feedback enabling unit further comprises:
a third inverter comprising:
   an input terminal coupled to the feedback signal generator; and
   an output terminal;
a first NOR gate comprising:
   a first input terminal coupled to the frequency delay signal generator and configured to receive the frequency delay signal;
   a second input terminal coupled to the frequency delay signal generator and configured to receive the inverse frequency delay signal; and
   an output terminal;

a second NOR gate comprising:
  a first input terminal coupled to the output terminal of the third inverter;
  a second input terminal coupled to the output terminal of the first NOR gate; and
  an output terminal;
a fourth inverter comprising:
  an input terminal coupled to the output terminal of the second NOR gate; and
  an output terminal; and
a fifth inverter comprising:
  an input terminal coupled to the output terminal of the fourth inverter; and
  an output terminal.

7. The self-controlled equalization circuit of claim 1, wherein the feedback signal generator comprises:
  a plurality of sixth inverters coupled in series and configured to delay a signal of the first output terminal of the second amplifier for outputting a feedback signal.

8. The self-controlled equalization circuit of claim 1, wherein the equalization control unit comprises:
  a sixth transistor comprising:
    a first terminal coupled to the first output terminal of the first amplifier;
    a second terminal; and
    a control terminal coupled to the feedback signal generator and configured to receive a feedback signal;
  a seventh transistor comprising:
    a first terminal coupled to the second output terminal of the first amplifier;
    a second terminal coupled to the second terminal of the sixth transistor; and
    a control terminal configured to receive the reference signal;
  a resistor comprising:
    a first terminal coupled to the second terminal of the sixth transistor; and
    a second terminal coupled to the second terminal of the seventh transistor;
  a capacitor comprising:
    a first terminal coupled to the second terminal of the sixth transistor; and a second terminal coupled to the second terminal of the seventh transistor;
an eighth transistor comprising:
  a first terminal coupled to the second terminal of the seventh transistor;
  a second terminal; and
  a control terminal configured to receive a biased voltage signal;
a ninth transistor comprising:
  a first terminal coupled to the second terminal of the eighth transistor;
  a second terminal coupled to a ground terminal; and
  a control terminal coupled to the feedback enabling unit.

9. The self-controlled equalization circuit of claim 1, wherein the gain control unit comprises:
  a tenth transistor comprising:
    a first terminal coupled to the first output terminal of the first amplifier;
    a second terminal; and
    a control terminal coupled to the feedback signal generator and configured to receive a feedback signal;
  an eleventh transistor comprising:
    a first terminal coupled to the second output terminal of the first amplifier;
    a second terminal coupled to the second terminal of the tenth transistor; and
    a control terminal configured to receive the reference signal; and
  a twelfth transistor comprising:
    a first terminal coupled to the second terminal of the eleventh transistor;
    a second terminal coupled to a ground terminal; and
    a control terminal configured to receive a biased voltage signal.

10. The self-controlled equalization circuit of claim 1, wherein noise of signals outputted from the first amplifier and the second amplifier is greater than noise of a signal outputted from the equalization control unit.

* * * * *